(12) United States Patent
Mitamura

(10) Patent No.: US 9,476,142 B2
(45) Date of Patent: Oct. 25, 2016

(54) METHOD FOR MANUFACTURING SILICON SINGLE CRYSTAL

(71) Applicant: SHIN-ETSU HANDOTAI CO., LTD., Tokyo (JP)

(72) Inventor: Nobuaki Mitamura, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 337 days.

(21) Appl. No.: 14/361,044

(22) PCT Filed: Nov. 20, 2012

(86) PCT No.: PCT/JP2012/007430
§ 371 (c)(1),
(2) Date: May 28, 2014

(87) PCT Pub. No.: WO2013/088646
PCT Pub. Date: Jun. 20, 2013

(65) Prior Publication Data
US 2014/0326174 A1 Nov. 6, 2014

(30) Foreign Application Priority Data
Dec. 16, 2011 (JP) .................................. 2011-276272

(51) Int. Cl.
C30B 15/30 (2006.01)
C30B 15/22 (2006.01)
C30B 15/36 (2006.01)
C30B 29/06 (2006.01)

(52) U.S. Cl.
CPC ............... *C30B 15/22* (2013.01); *C30B 15/36* (2013.01); *C30B 29/06* (2013.01)

(58) Field of Classification Search
CPC ........ C30B 15/20; C30B 15/30; C30B 15/36
See application file for complete search history.

(56) References Cited

U.S. PATENT DOCUMENTS 5,779,790 A 7/1998 Murai et al.
5,911,822 A 6/1999 Abe et al.
(Continued)

FOREIGN PATENT DOCUMENTS

JP A-05-139880 6/1993
JP A-06-263583 9/1994
(Continued)

OTHER PUBLICATIONS

Feb. 26, 2013 International Search Report issued in International Application No. PCT/JP2012/007430.

*Primary Examiner* — Robert M Kunemund
(74) *Attorney, Agent, or Firm* — Oliff PLC

(57) ABSTRACT

The present invention provides a method for manufacturing a silicon single crystal according to a Czochralski method: bringing a sharp end of a seed crystal into contact with a silicon melt; melting the seed crystal from the end up to a position at which the seed crystal has a predetermined diameter; growing the silicon single crystal without a Dash-Necking process, wherein the seed crystal is melted while a crucible is rotated at a rotational speed of 2 rpm or less, and the rotational speed of the crucible is decelerated to below the rotational speed at the time of the melting within 10 minutes after an end of the melting and a start of the crystal growth. The method avoids reduction in success rate for dislocation-free single crystal growth in manufacture of a heavy, large-diameter ingot and improves the productivity by the dislocation-free seeding method without the necking process.

8 Claims, 1 Drawing Sheet

(56) References Cited

U.S. PATENT DOCUMENTS

| | | | |
|---|---|---|---|
| 5,932,002 A * | 8/1999 | Izumi | C30B 15/36 117/13 |
| 6,019,836 A | 2/2000 | Izumi | |
| 6,162,292 A | 12/2000 | Iino | |
| 6,506,251 B1 | 1/2003 | Kitagawa et al. | |
| 7,179,330 B2 | 2/2007 | Fusegawa et al. | |
| 8,936,679 B2 * | 1/2015 | Banba | C30B 15/22 117/11 |

FOREIGN PATENT DOCUMENTS

| | | |
|---|---|---|
| JP | A-09-235186 | 9/1997 |
| JP | A-09-249482 | 9/1997 |
| JP | A-09-255485 | 9/1997 |
| JP | A-10-203898 | 8/1998 |
| JP | A-11-240793 | 9/1999 |
| JP | A-2004-083320 | 3/2004 |
| JP | A-2006-096617 | 4/2006 |
| WO | WO 01/63026 A1 | 8/2001 |
| WO | WO 03/091483 A1 | 11/2003 |

* cited by examiner

METHOD FOR MANUFACTURING SILICON SINGLE CRYSTAL

TECHNICAL FIELD

The present invention relates to a method for manufacturing a silicon single crystal according to a Czochralski method (a CZ method), by which a silicon single crystal ingot is grown with a seed crystal without a Dash Necking process.

BACKGROUND ART

In manufacture of a silicon single crystal according to the CZ method in the prior art, a seed crystal of silicon single crystal is brought into contact with a silicon melt, and then slowly pulled up while being rotated to grow a single crystal ingot. At this time, after the seed crystal is brought into contact with the silicon melt, in order to annihilate dislocations propagated from slip dislocations that are generated in the seed crystal in high density due to thermal shock, so-called a necking process for reducing a crystal diameter to approximately 3 mm to form a neck portion is carried out, then the crystal diameter is increased to a desired diameter to pull a dislocation-free silicon single crystal. Such a necking process is widely known as a Dash Necking method, which is common sense in the case of pulling a silicon single crystal ingot according to the CZ method.

That is, a seed crystal used in the prior art has a shape obtained by providing a notch portion, which is used for setting on a seed holder, in a cylindrical or prismatic single crystal having, e.g., a diameter or each side of approximately 8 to 20 mm, and a lower end shape that is brought into contact with a silicon melt first is a flat surface. Further, to safely pull while bearing with a weight of a single-crystal ingot having a heavy weight, it is hard to reduce a thickness of the seed crystal beyond the above-described value when strength of a material is taken into consideration.

Since the seed crystal having such a shape has a high heat capacity at an end thereof that comes into contact with the melt, an exponential temperature difference is produced in the crystal at the moment that the seed crystal comes into contact with the melt, and slip dislocations are provided in high density. Therefore, to annihilate the dislocations and grow the single crystal, the necking is required.

However, in such a state, even if various necking conditions are selected, a minimum diameter must be narrowed to 4 to 6 mm in order to eliminate dislocations, strength is not sufficient to support the single-crystal ingot with a heavy weight with a recent increase in diameter of the silicon single crystal, and a serious accident such as fracture of this narrow necking portion and falling the single crystal ingot may possibly occur during pulling the single crystal ingot.

To solve such a problem, the inventions like those described in Patent Literature 1 or Patent Literature 2 have been suggested. These inventions improve strength of the necking portion by forming a shape of an end portion of the seed crystal into a shape having a wedge shape or a hollow portion, reducing slip dislocations that are formed when the seed crystal comes into contact with the silicon melt as much as possible so that dislocations can be eliminated even if a diameter of the neck portion is relatively increased.

According to this method, since the thickness of the neck portion can be increased, the strength of the neck portion can be improved to some extent, but the neck portion with slip dislocations is still formed by performing the necking, the strength may be insufficient in case of pulling a single-crystal ingot that has a diameter and a length greatly increased in recent years and also has a weight of 150 Kg or more, and a solution to the root of the problem is yet to be found.

Thus, a method for single-crystallizing a crystal without forming a neck portion based on necking, which leads to the most serious problem in terms of strength, has been developed and suggested (Patent Literature 3). According to this method, as shown in FIG. 2, a seed crystal has a shape that is sharp at an end portion which is brought into contact with a silicon melt or a shape obtained by cutting off a sharp end, the end of the seed crystal is gently brought into contact with the silicon melt (FIG. 2 at (1)), the seed crystal is moved down at a low rate (Vdown) and melted until the end portion of the seed crystal has a desired thickness D (FIG. 2 at (2)), then the seed crystal is slowly moved up (Vup), and a silicon single crystal ingot having a desired diameter is grown without performing necking (FIG. 2 at (3)).

According to this method, when the end of the seed crystal is brought into contact with the silicon melt first, since a contact area is small and a heat capacity of the end portion is small, thermal shock or a sharp temperature gradient is not produced in the seed crystal, and hence the slip dislocation is not introduced. Further, when the seed crystal is then moved down at a low rate and melted until the end portion of the seed crystal has a desired thickness, the rapid temperature gradient is not produced, and hence the slip dislocation is not introduced into the seed crystal even during the melting. Furthermore, when the seed crystal is slowly moved up at last, since the seed crystal has a desired thickness and no dislocation, the necking does not have to be carried out, the strength is sufficient, and the seed crystal is thickened until a desired diameter is obtained, thereby growing the silicon single crystal ingot.

As described above, in a regular necking seeding method, a shape or a method for reducing thermal shock at the time of thermal insulation or heating of the seed crystal above the melt or seeding has been disclosed as a method for reducing initial dislocation density, but there is a limit in thickness of a neck, and it is impossible to follow a single crystal ingot having an increased diameter and an increased weight. Thus, a dislocation-free seeding method that can bear with an increase in diameter and an increase in weight mentioned above without performing the necking has been established.

A problem of this dislocation-free seeding method is a success rate for dislocation-free crystal. That is, in this method, when a dislocation is once introduced into the seed crystal, a retry process cannot be effected unless the seed crystal is replaced, and hence improving the success rate is particularly important. Moreover, in this case, even if the seeding is performed without dislocation, the slip dislocation is produced when a tapered end portion of the seed crystal is left in the vicinity of a silicon melting point after melting a predetermined length, or depending on a time required to start crystal growth or a growth rate at the time of shifting to growth of the single crystal, thus resulting in a problem that this dislocation increases.

Thus, to enhance the success rate in the dislocation-free seeding method, the inventions like those in Patent Literature 4, Patent Literature 5, and Patent Literature 6 have been suggested. These inventions suggest a retention time before the melting, a temperature at the melting, a melting rate, a retention time after the melting, a growth rate and a magnetic field intensity during crystal growth, and so on.

In the inventions suggested to enhance the success rate in the dislocation-free seeding method, as a common important item, there are contents that a silicon melt surface temperature T at which the seed crystal is melted is set to be higher than a melting point of silicon. According to Patent Literature 4, there is a description about the range that is higher than the silicon melting point by 25° C. or more and 45° C. or less. According to Patent Literature 5, there is a description that melting is effected at a temperature that a diameter of the crystal is reduced to be smaller than a diameter after end of melting by 0.3 mm or more and 2 mm or less in a section that is 3 mm for pulling from a position of end of the melting of the seed crystal. According to Patent Literature 6, there is a description about a temperature that is 10 to 20° C. higher than a temperature that is a suitable temperature in the Dash Necking method.

The necessity of melting the seed crystal at a temperature higher than the silicon melting point is that melting at the high temperature enables completely melting the seed crystal without leaving an unmelted part in the end portion of the seed crystal. That is because, in a state that a temperature of the silicon melt is not sufficiently high, the seed crystal in a solid state sinks into the silicon melt without rapidly melting the end of the seed crystal and the slip dislocation is produced.

Additionally, in an increase in weight due to recent realization of a long size of a pulled crystal or in an ultra-heavy-weight crystal like a next-generation crystal having a diameter of 450 mm, a minimum diameter required for supporting a single crystal ingot increases. In the next-generation crystal having a diameter of 450 mm in particular, a crystal weight exceeding one ton is assumed, in this case a minimum diameter of 10 mm or more is required for holding. When the minimum diameter of 10 mm is required, the seed crystal needs to be melted up to a portion having a diameter of 10 mm or more. When this diameter at the melting increases, even a thicker portion needs be rapidly melted, and hence a higher temperature is needed to melt this portion.

Unfortunately, the increase in the temperature at the melting required for increasing the success rate in the dislocation-free seeding method causes the following problem.

The problem of the increase in the temperature at the melting appears when the process shifts to the crystal growth after end of melting the seed crystal. The melting process smoothly advances if a temperature of the silicon melt is set to be higher than the melting point. However, if a temperature of the silicon melt immediately after end of melting is higher than the melting point, a diameter of the crystal is constricted to be smaller than a diameter immediately after end of melting as a matter of course when the crystal growth begins as it is, and the crystal is cut in some cases. Even if the crystal is not cut, the narrowed diameter results in a problem that strength is insufficient for holding the heavy-weight crystal.

Further, according to Patent Literature 4, there is a description that shifting to the crystal growth during a period of 0 to 10 minutes after end of melting enables improving the dislocation-free success rate but the dislocation-free success rate is lowered if this time becomes long. In case of shifting to the crystal growth during the period of 0 to 10 minutes after end of melting when the temperature at the melting is high, there is a problem that a temperature of the silicon melt cannot be rapidly lowered, a diameter is reduced after start of crystal growth, and strength is insufficient for holding the heavy-weight crystal.

An amount of silicon melt in a crucible in which a heavy-weight crystal is manufactured has a heavy weight and a high heat capacity, and a problem is to reduce a temperature of the silicon melt in a short time. To reduce the temperature of the silicon melt, a technique for lowering electric power of a heating graphite heater installed in a furnace is used, but a change in silicon melt temperature corresponding to a change in electric power of the heating graphite heater has a poor response, and hence it is very difficult to rapidly reduce the temperature of the silicon melt within a short time immediately after end of melting the seed crystal to start of the crystal growth.

In the conventional methods, the temperature at the melting is accordingly limited to ensure that the crystal diameter at the beginning of crystal growth after the melting is large enough to hold a heavy crystal body, although the temperature is set to be somewhat high. The above limitation hinders the temperature at the melting from being set to be sufficiently high to increase the success rate for dislocation-free crystal, resulting in a lower success rate for dislocation-free crystal.

CITATION LIST

Patent Literature

Patent Document 1: Japanese Unexamined Patent Application Publication No. H05-139880
Patent Document 2: Japanese Unexamined Patent Application Publication No. H09-255485
Patent Document 3: Japanese Unexamined Patent Application Publication No. H10-203898
Patent Document 4: Japanese Unexamined Patent Application Publication No. H11-240793
Patent Document 5: International Publication WO2001/063026
Patent Document 6: International Publication WO2003/091483

SUMMARY OF INVENTION

Technical Problem

In view of the problems in the prior art, it is an object of the present invention to provide a method for manufacturing a silicon single crystal, involving the dislocation-free seeding method without the Dash-Necking process, that can improve a success rate for dislocation-free single crystal growth and productivity in manufacture of heavy single crystal ingots with a large diameter.

Solution to Problem

To achieve the object, the present invention provides a method for manufacturing a silicon single crystal according to a Czochralski method, comprising: bringing a sharp end of a seed crystal into contact with a silicon melt; melting the seed crystal in the silicon melt from the end up to a position at which the seed crystal has a predetermined diameter; and then growing the silicon single crystal without a Dash-Necking process, wherein the seed crystal is melted while a crucible is rotated at a rotational speed of 2 rpm or less, and the rotational speed of the crucible is decelerated to below the rotational speed at the time of the melting within 10 minutes after an end of the melting and a start of the crystal growth.

Such an inventive method allows the temperature of the silicon melt surface to be decreased rapidly after melting the seed crystal and a crystal diameter right after the start of the crystal growth to be large enough to hold a heavy crystal body, even in the event that the temperature at which the seed crystal is melted is sufficiently high and the crystal growth is started right after the seed crystal has been melted. The method therefore enables the seed crystal to be melted at a higher temperature to improve the success rate of the dislocation-free seeding method.

The seed crystal is preferably melted in the silicon melt at a melting rate between 1 mm/min and 10 mm/min from the end up to a position at which the seed crystal has a diameter of 6 mm.

Such a method, involving adjustment of the melting rate in initial stage of the melting, prevents the seed crystal to be separated from the grown crystal even if the temperature at which the seed crystal is melted is high, improving the success rate of the dislocation-free seeding method effectively.

The rotational speed of the crucible is preferably decelerated to a rotational speed 0.1 rpm lower or more than the rotational speed at the time of the melting.

Such deceleration of the crucible rotation, with a deceleration range of 0.1 rpm or more, allows the temperature of the silicon melt surface to be effectively decreased.

The rotational speed of the crucible is preferably decelerated in 5 minutes or less.

Such a method allows the temperature at the center of the silicon melt surface to be decreased rapidly and a process of increasing the crystal diameter to be performed while keeping the crystal diameter large enough to hold a heavy crystal body.

Advantageous Effects of Invention

As described above, the inventive method for manufacturing a silicon single crystal according to a Czochralski method can achieve a high success rate for dislocation-free single crystal growth stably for a long period of time in the dislocation-free seeding method without performing the necking. The method can accordingly be applied for single crystal ingots having an increased diameter, length, and weight in the future, and significantly improve productivity, production yield, and costs.

DESCRIPTION OF EMBODIMENTS

Figure 1:
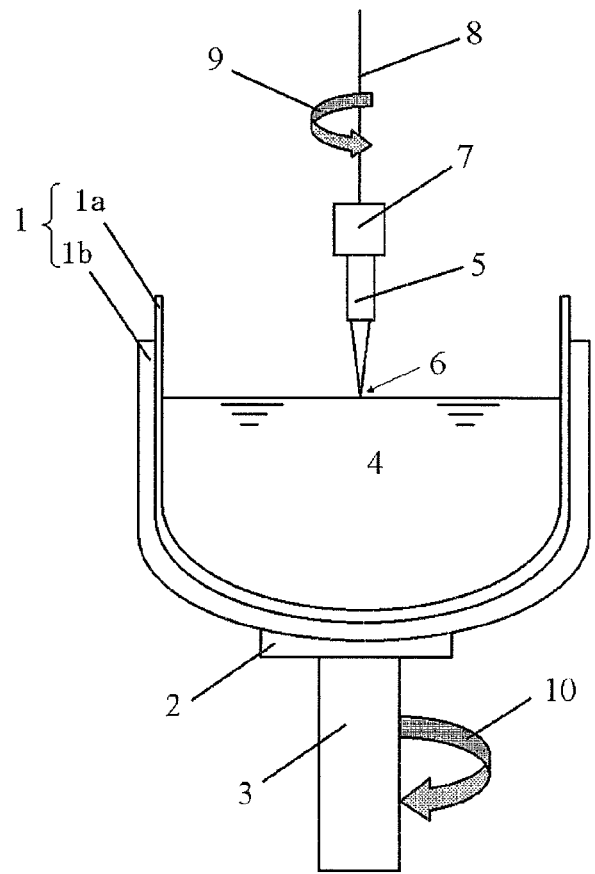
FIG. 1 is a schematic view of part of a furnace where a silicon single crystal is grown.
Figure 2:
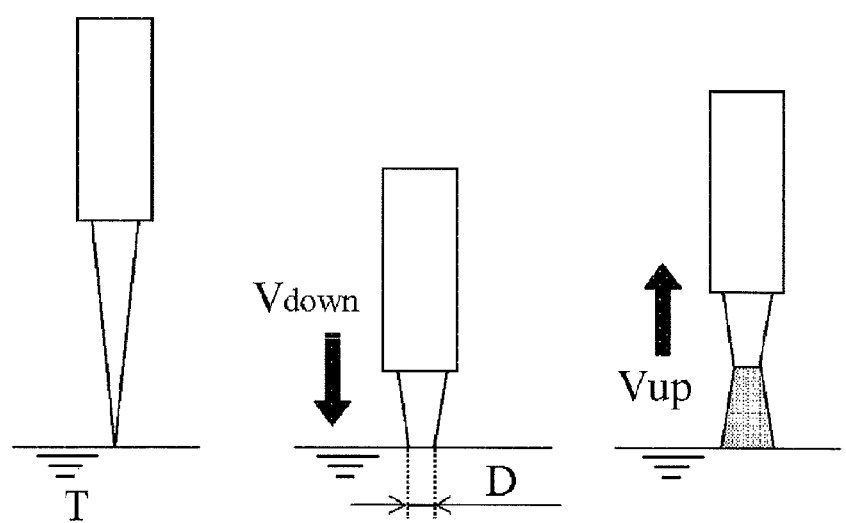
FIG. 2 is an explanatory view of the dislocation-free seeding method.

Although embodiments of the present invention will be described below, the present invention is not restricted thereto.

As described above, it is well known that it is important to set the temperature at which the seed crystal is melt to be higher than a melting point of silicon to increase the success rate of the dislocation-free seeding method. Unfortunately, such temperature setting arises a problem in that the temperature of the silicon melt cannot be lowered in a short time between immediately after the end of the melting the seed crystal and the start of the crystal growth, and the crystal diameter after the start of the crystal growth becomes too small to keep strength enough to hold a heavy crystal body.

As a result of repeatedly conducting keen examinations, the present inventor discovered that adjusting a rotational speed of a crucible after the seed crystal is melted enables the temperature of the silicon melt surface to be decreased in a short time with a good response, even if the temperature of the silicon melt surface is higher than a temperature in a conventional method to increase the success rate of the dislocation-free seeding method.

Table 1 shows comparison result of a variation in temperature of a silicon melt surface, a time required until the temperature started to decrease, a time required for stabilizing the temperature, when the temperature of the silicon melt surface was decreased between in the case of decreasing the temperature by decelerating the rotational speed of a crucible and by reducing the electric power of a graphite heater alone.

TABLE 1

| | Change conditions | | ΔT (° C.) | t1 (min) | t2 (min) |
|---|---|---|---|---|---|
| Temperature variation due to deceleration of crucible rotation | 0.5→0.1 rpm | Deceleration | −7 | <1 | 9 |
| | 1.0→0.1 rpm | Deceleration | −10 | <1 | 10 |
| Temperature variation due to reduction in electric power of heater | 150→146 kw | Down | −5 | 8 | 120 |
| | 150→140 kw | Down | −12 | 5 | 145 |

ΔT: a variation in temperature of a silicon melt surface
t1: a time required until the temperature started to decrease
t2: a time required for stabilizing temperature As shown in Table 1, the case of the deceleration of the crucible rotation demonstrated that the temperature started to decrease immediately after the deceleration of the crucible rotation, and the temperature was stabilized for approximately 10 minutes with quick response. In contrast, the case of the reduction in heater power alone demonstrated that there was a time lag until the temperature starts to decrease, and the temperature was stabilized after 2 hours from the start of the decrease in temperature. In the latter case, a temperature profile from the start of and the end of the decrease exhibits gradual reduction and the response is obviously worse than that of the case of the deceleration of the crucible rotation.

Based on this knowledge, the present inventor considered that the above method of decelerating the crucible rotation, which allows the temperature of the silicon melt surface to be quickly decreased stably every time, can be applied to the dislocation-free seeding method. The inventor finally studied whether the success rate for the dislocation-free crystal growth reaches a desired level under a certain condition in the growth of a silicon single crystal ingot by the dislocation-free seeding method without the necking process, then brought the present invention to completion.

The result of the study will be described below.

In this study, the present inventor set the temperature at which the seed crystal is melted to be higher than a melting point of silicon. Specifically, the temperature was set to be 5 to 15° C. higher than a temperature used in the prior art (a conventional temperature) to increase the success rate for the dislocation-free crystal growth.

Here, "the conventional temperature" represents "a temperature at which the crystal diameter is decreased by a range between 0.3 mm and 2 mm from the crystal diameter after the end of the melting in a 3-mm section of the grown crystal from a position at which the melting of the seed crystal is terminated", as disclosed in Patent Document 5 (hereinafter, the term is used to represent the same).

A specific and accurate temperature at the melting needs to be accurately measured with good reproducibility with a thermometer etc., from the outside of a single-crystal-growth furnace, but the measurement is very difficult. The thermometer is installed in every single-crystal-growth furnace not to measure an accurately absolute value of the temperature but to measure a relative value of the temperature in each growth furnace. The temperature at which the seed crystal is melted is obviously higher than the melting point of silicon, but a specific difference in temperature from the silicon melting point cannot be given by the thermometer.

Here, the temperature was set to a temperature that is 5 to 15° C. higher than the conventional temperature with a thermometer installed in the growth furnace.

Then, the temperature of the silicon melt surface was measured while the rotational speed of the crucible was decelerated by an adjusted width in an adjusted range to observe how the temperature varied.

Table 2 shows variation patterns of the crucible rotation, variations ΔT in the temperature of the silicon melt surface, the time from the start of variation in the rotational speed of the crucible to the start of variation in the temperature, and the time required for stabilizing the temperature from the start of the decrease. In Table 2, tests from No. 1 to No. 10 shows the results in the case where the rotational speed of the crucible was decelerated (including stop of rotation of crucible), whereas tests from No. 11 to No. 13 shows the results in the case where the rotational speed of the crucible was accelerated.

TABLE 2

| Test No. | Variation patterns of crucible rotation (rpm) | | ΔT (° C.) | t1 (min) | t2 (min) |
| --- | --- | --- | --- | --- | --- |
| 1 | 4.0→3.0 | Deceleration | 0 | — | — |
| 2 | 3.0→2.0 | Deceleration | 0 | — | — |
| 3 | 4.0→2.0 | Deceleration | 0 | — | — |
| 4 | 2.0→1.0 | Deceleration | −1 | <1 | 7 |
| 5 | 1.0→0.5 | Deceleration | −3 | <1 | 8 |
| 6 | 0.5→0.1 | Deceleration | −7 | <1 | 9 |
| 7 | 0.1→0 | Deceleration | −4 | <1 | 8 |
| 8 | 0.5→0 | Deceleration | −11 | <1 | 10 |
| 9 | 1.0→0.1 | Deceleration | −10 | <1 | 10 |
| 10 | 1.0→0 | Deceleration | −13 | <1 | 11 |
| 11 | 0.1→0.5 | Acceleration | +7 | <1 | 9 |
| 12 | 0.5→1.0 | Acceleration | +3 | <1 | 8 |
| 13 | 0→1.0 | Acceleration | +13 | <1 | 11 |

ΔT: a variation in temperature of a silicon melt surface
t1: a time from the start of variation in rotational speed of a crucible to the start of variation in temperature
t2: a time required for stabilizing temperature from the start of variation in temperature In the tests where the rotational speed of the crucible was decelerated within the range of a rotational speed of 2 rpm or less, the decrease in temperature of the silicon melt surface was observed. For the range of a rotational speed more than 2 rpm, the decrease in temperature of the silicon melt surface was not observed. In the tests where the rotational speed of the crucible was accelerated within the range of a rotational speed of 2 rpm or less, the temperature of the silicon melt surface increased.

As to the region of 2 rpm or less where the reduction in temperature was observed, as a result of allocating conditions for effecting the deceleration in detail and measuring a change in temperature of the silicon melt surface, it was revealed that the temperature of the silicon melt surface is greatly decreased when the rotational speed of the crucible was decelerated within the range of 1 rpm or less, particularly the range of 0.5 rpm or less.

The variation in temperature due to the deceleration of the rotational speed of the crucible was measured with a two-color thermometer installed in every single crystal growth furnace. As described above, this thermometer is configured to measure a relative value of the temperature of the growth furnace. Table 2 shows the results of the tests from No. 1 to No. 13 performed in a given single-crystal-growth furnace, and other tests performed in other single-crystal-growth furnaces demonstrated similar results of the temperature variation. In other words, the same degree of the temperature variation (ΔT) was observed in any single-crystal-growth furnace with excellent reproducibility.

It can also be understood that the reduction in temperature of the silicon melt surface began immediately after the start of the deceleration of the rotational speed of the crucible, and the time required for stabilizing the decreased temperature is as short as approximately 10 minutes. The temperature of the silicon melt is usually controlled by changing the electric power of the graphite heater. Unfortunately, as shown in Table 1, the silicon melt in the crucible for manufacturing a heavy crystal is very heavy and has a high heat capacity, and it is difficult to decrease the temperature of the silicon melt in a short time. The temperature of the silicon melt accordingly varies slowly in response to the variation in the electric power of the graphite heater. In contrast, the decrease in the crucible rotation allows the temperature of the silicon melt surface not only to be quickly decreased but also to be quickly stabilized.

This is because the decrease in the crucible rotation weakens flow of a convection current of the silicon melt having a relatively high temperature from the vicinity of a crucible wall near the graphite heater toward a central surface of the crucible, thereby decreasing the temperature of the silicon melt surface at the crucible center. The decrease in the temperature of the silicon melt surface at the crucible center, caused by a change in the silicon melt convection, quickly proceeds, unlike slow temperature variation due to heat conduction or radiation heat from the graphite heater.

Since such a decrease in temperature of the silicon melt surface due to the deceleration of the rotational speed of the crucible quickly proceeds, the deceleration of the crucible rotation at the time of melting the seed crystal may cause the temperature of the silicon melt surface to decrease during the melting and the end of the seed crystal to be hindered from being quickly melted and to dip into the silicon melt in a solid state, resulting in generation of slip dislocations. The crucible rotation accordingly needs to be decelerated at the earliest after the end of the melting. Moreover, when timing for decelerating rotation of the crucible is late, a reduction in temperature of the silicon melt surface due to the deceleration of rotation of the crucible is too late, a diameter required for holding a heavy-weight crystal may not be possibly maintained as a diameter after crystal growth, and hence the timing for decelerating rotation of the crucible must be set be within 10 minutes after start of the crystal growth at the latest.

The method for manufacturing a silicon single crystal according to the present invention will now be described hereinafter with reference to the drawings.

FIG. 1 is a schematic view of part of the inside of a furnace where a silicon single crystal is grown.

First, an end portion 6 of a sharp-ended seed crystal 5 held by a seed crystal holder 7 is brought into contact with a silicon melt 4.

Here, as a seed crystal used in the dislocation-free seeding method without necking according to the present invention, it is preferable to adopt a seed crystal that is conventionally used for the dislocation-free seeding method, has an end portion that is brought into contact with the silicon melt and formed into a sharp or truncated conical or pyramidal shape, and also has a body formed into a cylindrical or prismatic shape. Therefore, the sharp-ended seed crystal in the present invention includes such a seed crystal.

After bringing the end portion 6 into contact with the silicon melt 4, the seed crystal 5 is melted in the silicon melt 4 until a position of a predetermined diameter, e.g., a minimum diameter required for supporting a single-crystal ingot to be grown is reached.

This operation for melting the seed crystal 5 is carried out while rotating a crucible 1, which has a double structure formed by combining an inner quartz crucible 1a and an outer graphite crucible 1b (having a crucible support 2 on which a bottom portion of a main body of the graphite crucible 1b is fitted to integrally support this crucible) and is mounted and fixed on a pedestal 3 (a rotatable and ascendable/descendable support shaft), at 2 rpm or less.

Rotation of the crucible at the time of melting is set to 2 rpm or less since this is the range suitable for reducing a temperature of the silicon melt surface with a good immediate effect by using deceleration of rotation of the crucible as shown in Table 2.

Additionally, although not restricted in particular, as shown in Table 2, at the time of decelerating rotation of the crucible from 1 rpm or decelerating rotation of the crucible from 0.5 rpm, a reduction in temperature of the silicon melt surface is considerable, and hence setting 0.5 rpm or more is further preferable for rotation of the crucible at the time of the melting.

Further, after end of the melting of the seed crystal 5, when the seed crystal 5 is slowly pulled while being rotated based on rotation 9 of a seed wire 8, a silicon single crystal is grown. At this time, within 10 minutes after start of crystal growth from end of the melting, rotation 10 of the crucible is decelerated beyond a crucible rotation rate at the time of melting.

To shorten a shifting interval from end of the melting to start of the crystal growth as much as possible, it is preferable to complete the deceleration of rotation of the crucible within five minutes from start of the deceleration.

When rotation of the crucible is decelerated beyond the crucible rotation rate at the time of the melting within 10 minutes after start of the crystal growth from end of the melting, the temperature of the silicon melt surface can be lowered with a good immediate effect and, in particular, completing the deceleration of the crucible within five minutes from start of the deceleration enables shifting to diameter expansion while maintaining a diameter required for holding a heavy-weight crystal as a diameter after the crystal growth even if the temperature at the melting is sufficiently high and the process shifts to the crystal growth immediately after end of the melting.

As described above, the technique for reducing-electric power of the heating graphite heater alone cannot sufficiently decrease the temperature of the silicon melt surface with a good immediate effect, but the temperature of the central surface of the crucible in which the seed crystal is melted can be lowered with a good immediate effect by decelerating rotation of the crucible.

When this reduction in temperature with the good immediate effect is used, even though the temperature at the melting is sufficiently high, the process can be shifted to the crystal growth "within 0 to 10 minutes after end of the melting" during which the success rate for dislocation-free crystal can be improved, and a diameter required for holding a heavy-weight crystal can be maintained as a diameter after the crystal growth.

It is needless to say that, in the present invention, to reduce the temperature of the silicon melt surface, the deceleration of rotation of the crucible and the lowering of electric power of the heating graphite heater may be carried out at the same time.

When the temperature at the melting is increased, the sharp-ended seed crystal for dislocation-free seeding may be cut off from the silicon melt in an initial stage of melting from landing on the silicon melt in some cases. If the temperature at the melting is a temperature near a melting point of silicon, the seed crystal can be adapted to the silicon melt, and it is not cut off. However, when the temperature at the melting is increased, at the time of the melting in the initial stage that the seed crystal is narrow from the landing on the liquid, the seed crystal is highly possibly rapidly melted and cut off from the silicon melt.

When the seed crystal is cut off from the silicon melt in the initial stage of the melting that the end is narrow, an end shape of the seed crystal becomes flat rather than its original sharp shape. The end portion is formed into the sharp shape to succeed the dislocation-free seeding in the first place because its purpose is to reduce a contact area relative to the silicon melt, avoid thermal shock or a precipitous temperature gradient with respect to the seed crystal, and prevent slip dislocations from being introduced, and hence the seed crystal that is cut off during the melting and has the end flattened still has a sufficiently small cross-sectional area of the end, but slip dislocations are highly possibly introduced from the flattened end if the melting is again continued as it is, which can be obviously a cause of a reduction in success rate of the dislocation-free seeding.

Therefore, in such a case, the operation of melting the seed crystal in the melt can be performed at a melting rate of 1 mm/min or more and 10 mm/min or less in the range of a seed crystal diameter that is 6 mm from the end portion 6.

In case of further melting the seed crystal, the melting rate does not have to be increased, and it can be set to, e.g., 0.5 mm/min or more and 5 mm/min or less.

Here, Table 3 shows a summary of the temperature at the melting, the melting rate between the end of the seed crystal and a portion having a crystal diameter of 6 mm, an incidence of the seed crystal being separated during the melting under these conditions.

TABLE 3

| Temperature at melting | Melting rate between the end of a seed crystal and a portion having a crystal diameter of 6 mm | Incidence of a seed crystal being separated during melting |
| --- | --- | --- |
| Conventional temperature | 0.5 mm/min | 4% |
| | 1 mm/min | 0% |
| | 5 mm/min | 0% |
| | 5→1 m/min | 0% |
| | 10 mm/min | 0% |
| Conventional temperature + 5° C. | 0.5 mm/min | 30% |
| | 1 mm/min | 5% |
| | 5 mm/min | 0% |
| | 5→1 mm/min | 0% |
| | 10 mm/min | 0% |
| Conventional temperature + 10° C. | 0.5 mm/min | 40% |
| | 1 mm/min | 8% |
| | 5 m/min | 0% |
| | 5→1 mm/min | 0% |
| | 10 mm/min | 0% |

TABLE 3-continued

| Temperature at melting | Melting rate between the end of a seed crystal and a portion having a crystal diameter of 6 mm | Incidence of a seed crystal being separated during melting |
|---|---|---|
| Conventional temperature + 15° C. | 0.5 mm/min | 50% |
| | 1 m/min | 10% |
| | 5 mm/min | 0% |
| | 5→1 mm/min | 0% |
| | 10 mm/min | 0% |

As shown in Table 3, in case of melting at a temperature that is 5 to 15° C. higher than a conventional temperature, the cutoff of the seed crystal during the melting tends to readily occur as the temperature at the melting increases, but setting the melting rate to 1 mm/min or more enables suppressing a probability that the cutoff of the seed crystal occurs during the melting even in case of the melting in the initial stage that the seed crystal is narrow. Even if the temperature at the melting is high, since the cutoff of the seed crystal during the melting can be reduced as the melting rate is raised, it is possible to cope with raising the temperature at the melting by adjusting the melting rate.

Further, if the melting rate is 10 mm/min or less, since the seed crystal is rapidly melted on the melt surface, it is possible to eliminate a situation where the seed crystal in the solid state sinks into the silicon melt and slip dislocations are introduced, and hence the success rate for dislocation-free crystal can be further improved.

As described above, at the time of performing the operation of melting the seed crystal in the melt in the range that a temperature on the melt surface is sufficiently higher than the melting point of silicon in particular, performing this operation in the range of 1 mm/min or more and 10 mm/min or less as the melting rate in the stage that a seed crystal diameter is as narrow as 6 mm or less, which is an initial stage of the melting, enables avoiding a situation that the seed crystal is cut off from the silicon melt in the initial stage of the melting from landing of the seed crystal. When the seed crystal is cut off from the silicon melt, the end shape of the seed crystal changes to a flat shape rather than its original sharp shape, slip dislocations formed due to thermal shock or a precipitous temperature gradient relative to the seed crystal are highly possibly introduced if the melting of such a seed crystal is continued, and the success rate of the dislocation-free seeding method is lowered, but this problem can be avoided by adjusting the melting rate.

EXAMPLES

The present invention will be specifically described below with reference to an example and a comparative example, but the present invention is not restricted thereto.

Example and Comparative Example

Silicon single crystals were manufactured under conditions shown in Table 4 by the dislocation-free seeding method.

Table 4 shows the success rate for dislocation-free crystal growth when the diameter of a cone portion was increased to 300 mm by the dislocation-free seeding method.

The term "the success rate for dislocation-free crystal" used herein is defined by presence or absence of a crystal habit line when the diameter of the cone portion was increased to 300 mm, and the dislocation-free crystal is regarded as a failure when the crystal habit line disappears during the growth. This rate represents a ratio of the number of times the dislocation-free crystal was obtained until the cone diameter becomes 300 mm to the total number of trials. The total number of trials in Example and Comparative Example was 20.

The "melting rate" in Table 4 represents a melting rate while the seed crystal was melted from the end to a portion having a diameter of 6 mm. In the cases of a diameter at the melting of 8 mm and 10 mm, the melting rate while the seed crystal was melted above a portion having a diameter of 6 mm was the same as that of the melting rate at the melting of the portion having a diameter of 6 mm. Crystal growth was started immediately after the end of the melting.

TABLE 4

| | Temperature at melting | Melting rate | Crucible rotation after melting | Diameter at melting | Success rate of Dislocation-free crystal | Comment |
|---|---|---|---|---|---|---|
| Comparative Example 1 | Conventional temperature | 0.8 mm/min | No change (fixed at 0.5 rpm) | 6 mm | 80% | — |
| Comparative Example 2 | | | | 8 mm | 70% | — |
| Comparative Example 3 | | | | 10 mm | 5% | — |
| Comparative Example 4 | Conventional temperature + 10° C. | | | 6 mm | 0% | Canceled because the crystal diameter was less than 5 mm after start of crystal growth |
| Comparative Example 5 | | | | 8 mm | 0% | |
| Comparative Example 6 | | | | 10 mm | 0% | |
| Example 1 | | | 1.0→0.1 rpm within 1 min after end of melting (time required for change was 1 min) | 6 mm | 95% | — |
| Example 2 | | | | 8 mm | 90% | — |
| Example 3 | | | | 10 mm | 90% | — |
| Example 4 | | 5→1 mm/min | | 6 mm | 100% | — |
| Example 5 | | | | 8 mm | 95% | — |
| Example 6 | | | | 10 mm | 95% | — |

Table 4 shows the success rate for the dislocation-free crystal growth when the trials were implemented under conditions of two levels of the temperature at the melting, two levels of the melting rate, two levels of setting of the crucible rotation after the end of the melting, and three levels of the diameter at the melting.

As shown in Table 4, under conditions of a conventional temperature, a melting rate of 0.8 mm/min, and the crucible being rotated at a rotational speed of fixed at 0.5 rpm after the end of the melting (Comparative Examples 1 to 3), the success rate of dislocation-free crystal was 70% or more with the diameter at the melting set at 6 mm and 8 mm, whereas the success rate of dislocation-free crystal greatly decreased with the diameter at the melting set at 10 mm. The reason why the success rate decreased in the case where the diameter at the melting was large as 10 mm is considered as follows: Since the conventional temperature was not sufficiently high, the seed crystal was not rapidly melted on the melt surface in the final stage of the melting, where the diameter of the portion to be melted gradually increases, and dipped into the silicon melt in a solid state so that slip dislocations were generated, and the success rate for dislocation-free crystal decreased.

In a case where the temperature at the melting was set to be 10° C. higher than the conventional temperature, when the melting rate was 0.8 mm/min and rotation of the crucible after end of the melting was fixed at 0.5 rpm (Comparative Examples 4 to 6), the diameter was reduced to 5 mm or less immediately after start of the crystal growth, a failure was determined since this value was a diameter with strength insufficient to hold a heavy-weight crystal, and cone diameter expansion was canceled. That is, an improvement in success rate for dislocation-free crystal cannot be expected by just simply setting the temperature at the melting to a high value.

When the temperature at the melting was set to be 10° C. higher than the conventional temperature, under conditions that the melting rate was 0.8 mm/min and rotation of the crucible after end of the melting was reduced from 1.0 to 0.1 rpm (Examples 1 to 3), an inconvenience that the diameter was too small even after start of the crystal growth did not occur, and the dislocation-free success rate was 90% or more and hence excellent on all the three levels of the diameter at the melting. It was likewise confirmed that the success rate for dislocation-free crystal can be improved by raising the temperature at the melting.

Moreover, when the temperature at the melting was set to be 10° C. higher than the conventional temperature, under conditions that the melting rate was reduced from 5 mm/min to 1 mm/min and rotation of the crucible after end of the melting was decelerated from 1.0 to 0.1 rpm (Examples 4 to 6), although the temperature at the melting was set to be high, cutoff of the seed crystal during the melting did not occur, and the success rate for dislocation-free crystal was improved to 95% on all the three levels of the diameter at the melting.

As described above, since a side effect that the diameter after start of the crystal growth is reduced is developed when the temperature at the melting is simply increased, using a change in temperature of the silicon melt caused due to a change in rotation of the crucible after completion of the melting as a countermeasure enables avoiding the side effect and providing an effect, i.e., an improvement in success rate for dislocation-free crystal due to raising the temperature at the melting. Additionally, when the melting rate is adjusted, the success rate for dislocation-free crystal can be further improved.

As a merit provided by raising the temperature at the melting, an effect is greatly exercised when the diameter at the melting is large in particular. As described above, that is because the seed crystal is not rapidly melted on the melt surface at the time of melting a large diameter, the seed crystal in the solid state sinks into the silicon melt, and slip dislocations are readily introduced, which means that the melting at a high temperature is effective for avoiding this problem. In an ultra-heavy-weight crystal such as a next-generation crystal having a diameter of 450 mm, a crystal weight exceeding one ton is assumed, and 10 mm or more is required as a minimum diameter required for holding in this case. When the minimum diameter of 10 mm is required, the diameter at the melting is 10 mm or more as a matter of course. In such a case, the present invention can exercise the effectiveness in particular, thereby avoiding a situation that a diameter is reduced after start of the crystal growth and strength is insufficient for holding the heavy-weight crystal.

It is to be noted that the present invention is not restricted to the foregoing embodiment. The foregoing embodiment is just an illustrative example, and any example that has substantially the same configuration and exercises the same functions and effects as the technical concept described in claims of the present invention is included in the technical scope of the present invention.

For example, in the embodiment according to the present invention, a cone diameter expansion portion having a diameter of 300 mm is grown, and it is possible to sufficiently cope with an increase in diameter to a diameter of 400 mm (16 inches) that can be assumed in the future and an ultra-heavy-weight crystal like a crystal having a diameter of 450 mm further in the future. In the present invention, since necking is not carried out and dislocations are not produced, when a limit value or a lower value of physicality of a silicon single crystal itself can be applied to even pulling of a single crystal ingot having any diameter, any length, and any heavy weight in principle without using a complicated apparatus such as a crystal holding apparatus.

Furthermore, the present invention can be applied to not only the regular Czochralski method but also an MCZ method (Magnetic field applied Czochralski crystal growth method) for applying a magnetic field at the time of pulling a silicon single crystal.

The invention claimed is:

1. A method for manufacturing a silicon single crystal according to a Czochralski method, comprising: bringing a sharp end of a seed crystal into contact with a silicon melt; melting the seed crystal in the silicon melt from the end up to a position at which the seed crystal has a predetermined diameter; and then growing the silicon single crystal without a Dash-Necking process, wherein
   the seed crystal is melted while a crucible is rotated at a rotational speed of 2 rpm or less, and the rotational speed of the crucible is decelerated to below the rotational speed at the time of the melting within 10 minutes after an end of the melting and a start of the crystal growth.

2. The method for manufacturing a silicon single crystal according to claim 1,
   wherein the seed crystal is melted in the silicon melt at a melting rate between 1 mm/min and 10 mm/min from the end up to a position at which the seed crystal has a diameter of 6 mm.

3. The method for manufacturing a silicon single crystal according to claim 1,
   wherein the rotational speed of the crucible is decelerated to a rotational speed 0.1 rpm lower or more than the rotational speed at the time of the melting.

4. The method for manufacturing a silicon single crystal according to claim 2,
   wherein the rotational speed of the crucible is decelerated to a rotational speed 0.1 rpm lower or more than the rotational speed at the time of the melting.

5. The method for manufacturing a silicon single crystal according to claim 1,
  wherein the rotational speed of the crucible is decelerated in 5 minutes or less.

6. The method for manufacturing a silicon single crystal according to claim 2,
  wherein the rotational speed of the crucible is decelerated in 5 minutes or less.

7. The method for manufacturing a silicon single crystal according to claim 3,
  wherein the rotational speed of the crucible is decelerated in 5 minutes or less.

8. The method for manufacturing a silicon single crystal according to claim 4,
  wherein the rotational speed of the crucible is decelerated in 5 minutes or less.

\* \* \* \* \*